United States Patent
Jeon et al.

(10) Patent No.: US 11,754,628 B2
(45) Date of Patent: Sep. 12, 2023

(54) CONTACT TEST DEVICE FOR HI-POT TEST AND HI-POT TEST SYSTEM HAVING THE SAME

(71) Applicant: SK On Co., Ltd., Seoul (KR)

(72) Inventors: Jae Geun Jeon, Daejeon (KR); Kyeong Tae Park, Daejeon (KR)

(73) Assignee: SK On Co., Ltd., Seoul (KR)

( * ) Notice: Subject to any disclaimer, the term of this patent is extended or adjusted under 35 U.S.C. 154(b) by 0 days.

(21) Appl. No.: 17/737,156

(22) Filed: May 5, 2022

(65) Prior Publication Data
US 2023/0003800 A1 Jan. 5, 2023

(30) Foreign Application Priority Data
Jul. 2, 2021 (KR) .................. 10-2021-0087311

(51) Int. Cl.
*G01R 31/364* (2019.01)
*G01R 31/54* (2020.01)

(52) U.S. Cl.
CPC ........... *G01R 31/364* (2019.01); *G01R 31/54* (2020.01)

(58) Field of Classification Search
CPC .... G01R 31/364; G01R 31/54; G01R 31/327; G01R 19/145; G01R 31/52; G01R 31/385
See application file for complete search history.

(56) References Cited

U.S. PATENT DOCUMENTS

| 6,300,774 B1 | 10/2001 | Lim | |
|---|---|---|---|
| 2023/0038456 A1* | 2/2023 | Lee | H01M 10/4285 |

FOREIGN PATENT DOCUMENTS

| CN | 115184822 A | * | 10/2022 |
| JP | 2011247668 A | * | 12/2011 |
| KR | 10-1999-0001713 A | | 1/1999 |
| KR | 20-0268679 Y1 | | 3/2002 |
| KR | 20230055077 A | * | 4/2023 |

* cited by examiner

Primary Examiner — Christopher E Mahoney
(74) Attorney, Agent, or Firm — IP&T Group LLP

(57) ABSTRACT

A contact test device for a hi-pot test includes: a contact test device connected to a hi-pot test device in parallel by lines branched from first and second lines of the hi-pot test device by being connected to first and second terminals of a battery through first and second probes, respectively, and having third and fourth probes directly connected to the first and second terminals, wherein the contact test device includes: a first closed loop including first to third switch units, a direct current (DC) voltage source and a first continuity detection unit; a second closed loop including fourth to sixth switch units, the DC voltage source and a second continuity detection unit; and a control unit controlling turning the first to sixth switch units on and off and detecting a continuity signal of each of the first and second continuity detection units.

10 Claims, 12 Drawing Sheets

CONTACT TEST DEVICE FOR HI-POT TEST AND HI-POT TEST SYSTEM HAVING THE SAME

CROSS-REFERENCE TO RELATED APPLICATION(S)

This application claims benefit of priority to Korean Patent Application No. 10-2021-0087311 filed on Jul. 2, 2021 in the Korean Intellectual Property Office, the disclosure of which is incorporated herein by reference in its entirety.

BACKGROUND

1. Field

The present disclosure relates to a contact test device for a hi-pot test and a hi-pot test system having the same.

2. Description of Related Art

A secondary battery is a battery which may be charged and discharged and thus repeatedly used. The secondary battery may be a single battery cell and used in a portable small electronic device such as a mobile phone, a laptop computer, a camera, a camcorder, or may be a battery pack including the plurality of battery cells and used as a power source for driving a motor such as a high-output hybrid electric vehicle (HEV) or electric vehicle (EV).

A battery used in the hybrid electric vehicle (HEV) or the electric vehicle (EV) may be required to implement high output and high capacity. For this reason, the plurality of batteries may form a unit battery pack, and the plurality of battery packs may be electrically connected in series or parallel to each other, to be driven as high-capacity and high-output power source.

As such, the battery pack may be driven as the high-capacity high-output power source, thus increasing importance of a hi-pot test of the battery pack. In this regard, the hi-pot test of the battery pack is required to be performed after a probe of a hi-pot test device is connected to a terminal of the battery pack. However, a conventional hi-pot test device is unable to detect whether its probe is actually connected to the terminal of the battery, and thus fails to secure reliability of the hi-pot test.

SUMMARY

An aspect of the present disclosure may provide a contact test device for a hi-pot test, which may test whether a battery and a hi-pot test device are connected to each other when performing a hi-pot test of the battery.

Another aspect of the present disclosure may provide a hi-pot test system which may test whether a battery and a hi-pot test device are connected to each other when performing a hi-pot test of the battery.

According to an aspect of the present disclosure, a contact test device for a hi-pot test may include: a contact test device connected to a hi-pot test device in parallel by lines branched from first and second lines of the hi-pot test device performing a hi-pot test by being connected to first and second terminals of a battery through first and second probes, respectively, and connected to the first and second probes through the first and second lines, respectively, and having third and fourth probes directly connected to the first and second terminals of the battery, wherein the contact test device includes: a first closed loop connected to the first line, and including first to third switch units connected to each other in series, a direct current (DC) voltage source and a first continuity detection unit, the first line being connected between the first switch unit and the second switch unit, and the third probe being connected between the second switch unit and the third switch unit; a second closed loop connected to the second line, and including fourth to sixth switch units connected to each other in series, the DC voltage source and a second continuity detection unit, the second line being connected between the fifth switch unit and the sixth switch unit, and the fourth probe being connected between the fourth switch unit and the fifth switch unit; and a control unit controlling turning the first to sixth switch units on and off and detecting a continuity signal of each of the first and second continuity detection units.

According to another aspect of the present disclosure, a hi-pot test system may include: a hi-pot test device performing a hi-pot test by being connected to first and second terminals of a battery through first and second probes, respectively, the first and second probes being connected to the hi-pot test device respectively through first and second lines; and a contact test device connected to the hi-pot test device in parallel by lines branched from the first and second lines, and having third and fourth probes directly connected to the first and second terminals of the battery, wherein the contact test device includes: a first closed loop connected to the first line, and including first to third switch units connected to each other in series, a direct current (DC) voltage source and a first continuity detection unit, the first line being connected between the first switch unit and the second switch unit, and the third probe being connected between the second switch unit and the third switch unit; a second closed loop connected to the second line, and including fourth to sixth switch units connected to each other in series, the DC voltage source and a second continuity detection unit, the second line being connected between the fifth switch unit and the sixth switch unit, and the fourth probe being connected between the fourth switch unit and the fifth switch unit; and a control unit controlling turning the first to sixth switch units on and off and detecting a continuity signal of each of the first and second continuity detection units.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will now be described in detail with reference to the accompanying drawings.

Figure 1:
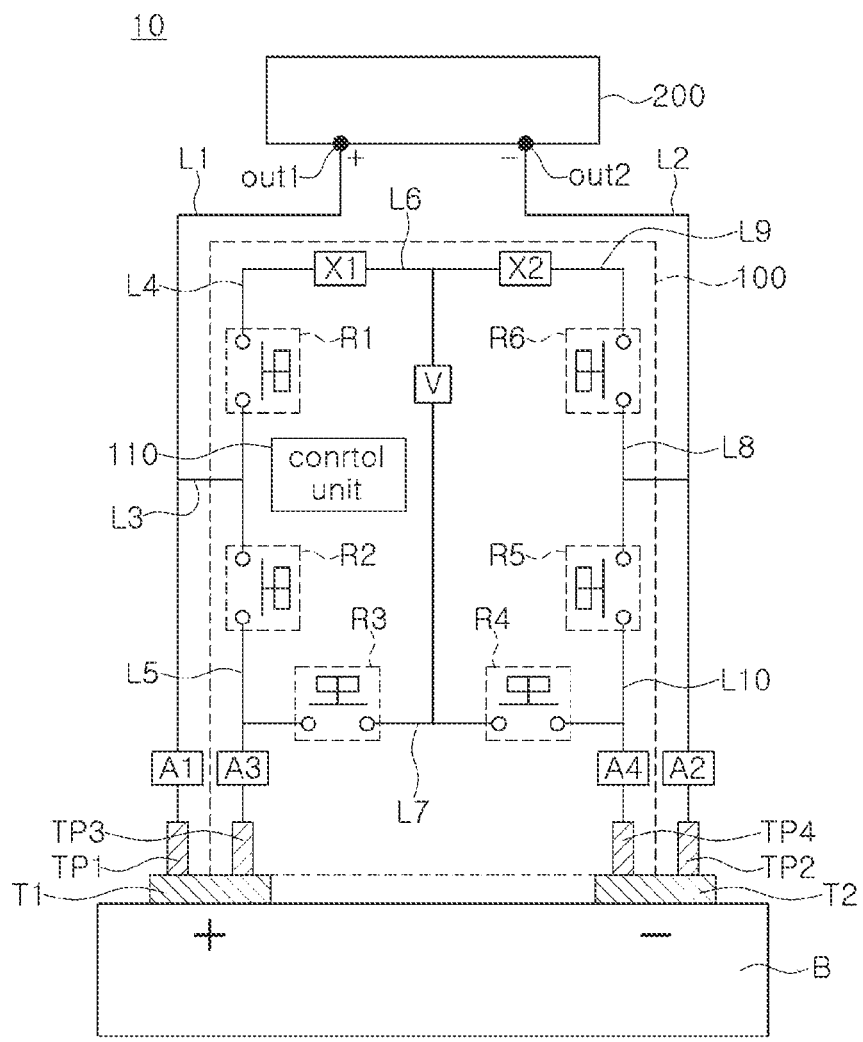
FIG. 1 is a schematic block diagram of a hi-pot test system according to an exemplary embodiment of the present disclosure.
Figure 2:
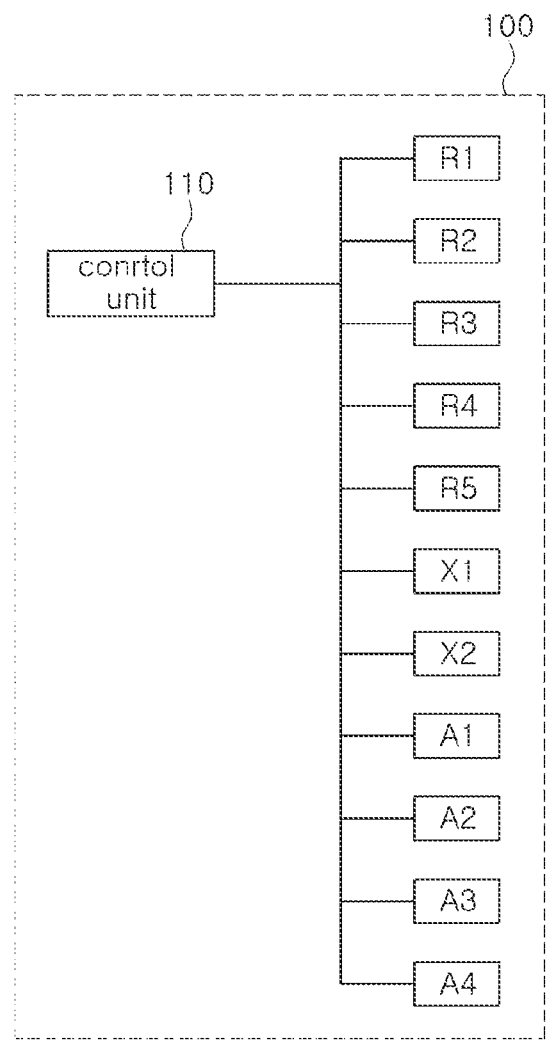
FIG. 2 is a block diagram illustrating a control of a contact test device.

The description describes a hi-pot test system according to an exemplary embodiment with reference to FIGS. 1 and 2. FIG. 1 is a schematic block diagram of the hi-pot test system according to an exemplary embodiment of the present disclosure; and FIG. 2 is a block diagram illustrating the control of the contact test device.

Referring to FIG. 1, a hi-pot test system 10 according to an exemplary embodiment may include a hi-pot test device 200 connected to a battery B to perform a hi-pot test and a contact test device 100 testing whether the hi-pot test device 200 and the battery B are actually connected to each other. The contact test device 100 of an exemplary embodiment may be applied to a finished battery product such as a battery cell, a battery module and a battery pack, and a half-finished product in an intermediate stage of manufacturing the finished battery product.

The hi-pot test device 200 may be a withstanding voltage tester (i.e. hi-pot tester) connecting first and second probes to first and second terminals T1 and T2 of the battery B, which is a test subject, and applying a high voltage of up to 500 Vdc thereto to perform a withstand voltage test (i.e. a hi-pot test). First and second output terminals out1 and out2 of the hi-pot test device 200 may respectively be connected to first and second lines L1 and L2, and first and second probes TP1 and TP2 may respectively be connected to ends of the first and second lines L1 and L2. The first and second probes TP1 and TP2 may respectively be moved forward and backward by first and second drive units A1 and A2 controlled by a control unit 110 to respectively be connected with the first and second terminals T1 and T2. However, some exemplary embodiments may omit the first and second drive units A1 and A2.

The contact test device 100 may test whether the first and second probes TP1 and TP2 of the hi-pot test device 200 are actually connected to the first and second terminals T1 and T2 of the battery B before performing the hi-pot test. Referring to FIGS. 1 and 2, the contact test device 100 may include first to sixth switch units R1 to R6, first and second continuity detection units X1 and X2, third and fourth probes TP3 and TP4, and a direct current (DC) voltage source V and the control unit 110. The contact test device 100 may be connected to the hi-pot test device 200 through third and eighth lines L3 and L8 branched from the first and second lines L1 and L2, and connected to the first and second terminals T1 and T2 of the battery B through the third and fourth probes TP3 and TP4. The third and fourth probes TP3 and TP4 may respectively be spaced apart from the first and second probes TP1 and TP2, and may respectively form one line including the first probe TP1, the first terminal T1 and the third probe TP3 and the other line including the second probe TP2, the second terminal T2 and the fourth probe TP4.

The first to sixth switch units R1 to R6 may be turned on or off based on a control of the control unit 110 to block a current supplied from the DC voltage source V. The first to sixth switch units R1 to R6 may be power relay.

The first to third switch units R1 to R3 may form a closed loop including the first continuity detection unit and the DC voltage source V. The first and second switch units R1 and R2 may be respectively connected to the first line L1 through the third line L3. The third switch unit R3 may be connected to the second switch unit R2 through a fifth line L5, and connected to the DC voltage source V and the fourth switch unit R4 through a seventh line L7.

The fourth to sixth switch units R4 to R6 may form a closed loop including the second continuity detection unit and the DC voltage source V. The fifth and sixth switch units R5 and R6 may be respectively connected to the second line L2 through the eighth line L8. The fourth switch unit R4 may be connected to the fifth switch unit R5 through a tenth line L10, and connected to the DC voltage source V and the third switch unit R3 through the seventh line L7.

The first and second continuity detection units X1 and X2 may each transmit a continuity signal to the control unit 110 when the current flows in the line. The first and second continuity detection units X1 and X2 may each transmit an electrical signal directly to the control unit 110 when the current flows in the line. For example, the first and second continuity detection units X1 and X2 may each transmit an ON signal to the control unit 110 when the current flows in the line. In an exemplary embodiment, the first and second continuity detection units X1 and X2 may each be configured as a relay. However, the present disclosure is not limited thereto, and the first and second continuity detection units X1 and X2 may emit light when the current flows through the line. In this case, a light receiving unit may be further required to detect the light emitted from the first and second continuity detection units X1 and X2, and the light receiving unit may transmit the electrical signal to the control unit 110 when the light is emitted from the first and second continuity detection units X1 and X2.

The first continuity detection unit X1 may be positioned between the first switch unit R1 and the DC voltage source V, and the second continuity detection unit X2 may be positioned between the sixth switch unit R6 and the DC voltage source V.

The DC voltage source V may be disposed between a sixth line L6 and the seventh line L7 to supply a DC voltage. In an exemplary embodiment, a DC voltage source V may supply a voltage of 24 V.

The third and fourth probes TP3 and TP4 may respectively be branched from the fifth and tenth lines L5 and L10, and connected to the first and second terminals T1 and T2 of the battery B. The third and fourth probes TP3 and TP4 may be spaced apart from the first and second probes TP1 and TP2, and may respectively form one line including the first probe TP1, the first terminal T1 and the third probe TP3 and the other line including the second probe TP2, the second terminal T2 and the fourth probe TP4. The third and fourth probes TP3 and TP4 may respectively be moved forward and backward by third and fourth drive units A3 and A4 controlled by the control unit 110 to respectively be connected with the first and second terminals T1 and T2. However, some exemplary embodiments may omit the third and fourth drive units A3 and A4.

The control unit 110 may control an overall operation of the contact test device 100, may be implemented, for example, as a control device such as a central processing unit (CPU), a graphic processing unit (GPU), a microprocessor, an application specific integrated circuit (ASIC), a field programmable gate arrays (FPGA), a programmable logic control unit (PLC), and may include a memory storing various data necessary for the operation of the contact test device 100. The control unit 110 may control the first to sixth switch units R1 to R6, the first and second continuity detection units X1 and X2, and first to fourth drive units A1 to A4, and receive the electrical signal transmitted from each of the first and second continuity detection units X1 and X2. The control unit 110 may detect the number of times that the first to sixth switch units R1 to R6 are respectively turned on and off, and send an alarm to a user by using an image or a sound when the first to sixth switch units R1 to R6 are turned on and off more than a pre-stored limit number of times.

The hi-pot test of the battery B may test whether it is possible to secure safety of the battery B even when the high voltage is applied to the battery B. The hi-pot test is required to be performed in a state where the first and second probes TP1 and TP2 of the hi-pot test device 200 are actually connected to the first and second terminals T1 and T2 of the battery B. However, a problem may occur in which the battery passes hi-pot test when the hi-pot test is performed in a state where at least one of the first and second probes TP1 and TP2 of the hi-pot test device 200 is not actually connected to the first or second terminal T1 or T2 of the battery B. The hi-pot test system 10 according to an exemplary embodiment may include the contact test device 100 testing whether the hi-pot test device 200 and the battery B are actually connected to each other, thereby fundamentally prevent a case where the hi-pot test is performed in the state where at least one of the first and second terminals T1 and T2 of the battery B is not actually connected with the first and second probes TP1 and TP2 of the hi-pot test device 200.

The description describes an operation of the hi-pot test system 10 according to an exemplary embodiment with reference to Table 1 below and FIGS. 3 through 12.

TABLE 1

| | R1 | R2 | R3 | R4 | R5 | R6 | Condition for passing the test. |
|---|---|---|---|---|---|---|---|
| First test (Test whether R1 to R6 are open) | ON | ON | ON | ON | ON | ON | X1: ON X2: ON |
| Second test (Test whether R1 is short-circuited) | OFF | ON | ON | OFF | OFF | OFF | X1: OFF |
| Third test (Test whether R2 is short-circuited) | ON | OFF | ON | OFF | OFF | OFF | X1: OFF |
| Fourth test (Test whether R3 is short-circuited) | ON | ON | OFF | OFF | OFF | OFF | X1: OFF |
| Fifth test (Test whether R4 is short-circuited) | OFF | OFF | OFF | OFF | ON | ON | X2: OFF |
| Sixth test (Test whether R5 is short-circuited) | OFF | OFF | OFF | ON | OFF | ON | X2: OFF |
| Seventh test (Test whether R6 is short-circuited) | OFF | OFF | OFF | ON | ON | OFF | X2: OFF |
| Eighth test (Test whether the first terminal is connected) | ON | OFF | ON | OFF | OFF | OFF | X1: ON |
| Ninth test (Test whether the second terminal is connected) | OFF | OFF | OFF | ON | OFF | ON | X2: ON |
| Tenth test (Hi-pot test) | OFF | OFF | OFF | OFF | OFF | OFF | |

The hi-pot test system 10 may perform the first to ninth tests performed by the contact test device 1030 before the tenth test performed by the hi-pot test device 200 to check whether the first and second probes TP1 and TP2 of the hi-pot test device 2003 are directly connected to the first and second terminals T1 and T2 of the battery B. The first to seventh tests are tests to check whether the first to sixth switch units R1 to R6 are normally operated before checking the connections of the first and second probes TP1 and TP2, and the eighth and ninth tests are tests to check the connections of the first and second probes TP1 and TP2. The first to sixth switch units R1 to R6 may have a limited number of operations, and may be very easily breakdown due to insulation breakdown or short circuit caused by the high voltage applied thereto. Therefore, it is possible to secure reliability of a test result when first performing a test to check whether the first to sixth switch units R1 to R6 are normally operated before checking the connections of the first and second probes TP1 and TP2.

Figure 3:
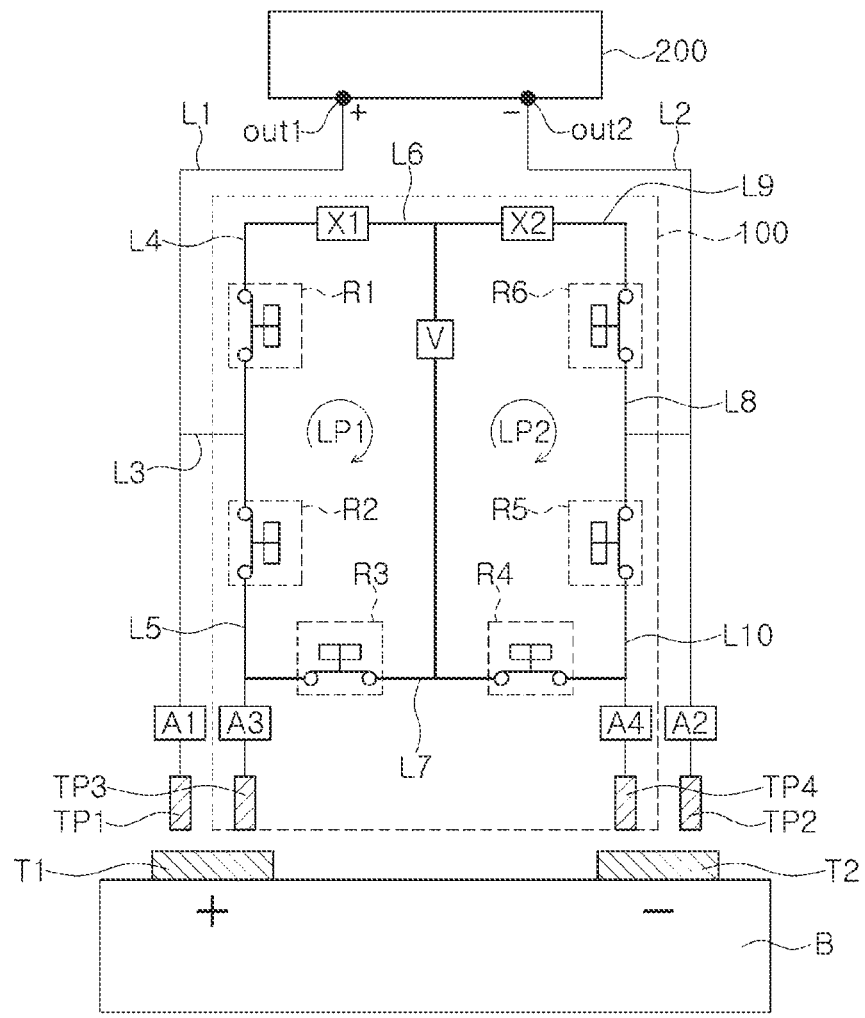
FIGS. 3 through 12 are diagrams illustrating an operation of the hi-pot test system of FIG. 1.

Referring to Table 1 and FIG. 3, the control unit 110 may perform the first test. The first test may be a test for checking whether the first to sixth switch units R1 to R6 are defective in not being operated while being open. The control unit 110 may drive the first to fourth drive units A1 to A4 to disconnect the first to fourth probes TP1 to TP4 from the first and second terminals T1 and T2 of the battery B. The control unit 110 may turn on all the first to sixth switch units R1 to R6 to form first and second closed loops LP1 and LP2, and check whether the ON signal is transmitted from each of the first and second continuity detection units X1 and X2. When the ON signals are transmitted from both the first and second continuity detection units X1 and X2, it may be confirmed that the first to sixth switch units R1 to R6 are not open. When an OFF signal is transmitted from at least one of the first and second continuity detection units X1 and X2, the control unit 110 may stop the test and send the alarm.

Figure 4:
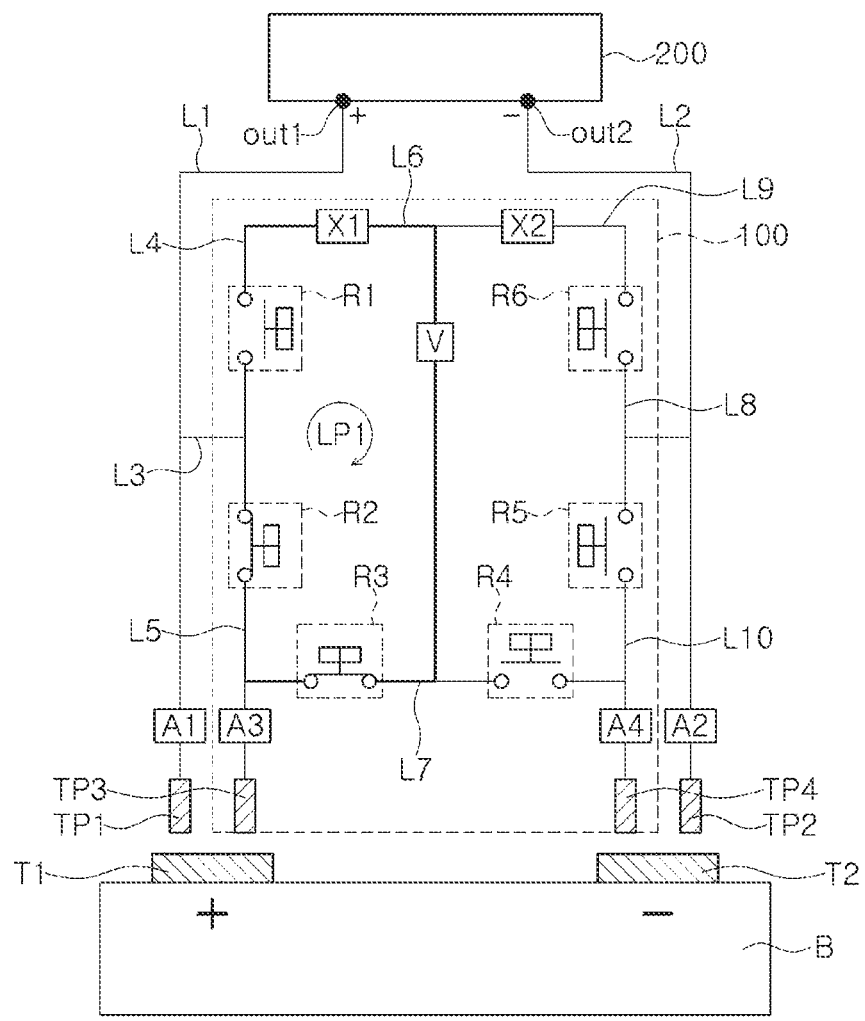

Referring to Table 1 and FIG. 4, the control unit 110 may perform the second test. The second test is a test for checking whether the first switch unit R1 is defective in not being operated while being short-circuited. The control unit 110 may maintain the first to fourth probes TP1 to TP4 to be disconnected from the first and second terminals T1 and T2 of the battery B. The control unit 110 may turn off the first switch unit R1 and the fourth to sixth switch units R4 to R6, turn on the second and third switch units R2 and R3, and then check whether the OFF signal is transmitted from the first continuity detection unit X1. When the OFF signal is transmitted from the first continuity detection unit X1, it may be confirmed that the first switch unit R1 is normally operated. On the other hand, when the ON signal is transmitted from the first continuity detection unit X1, it may be confirmed that the first switch unit R1 is defective in not being operated while being short-circuited, thus forming the first closed loop LP1. When the ON signal is transmitted from the first continuity detection unit X1, the control unit 110 may stop the test and send the alarm.

Figure 5:
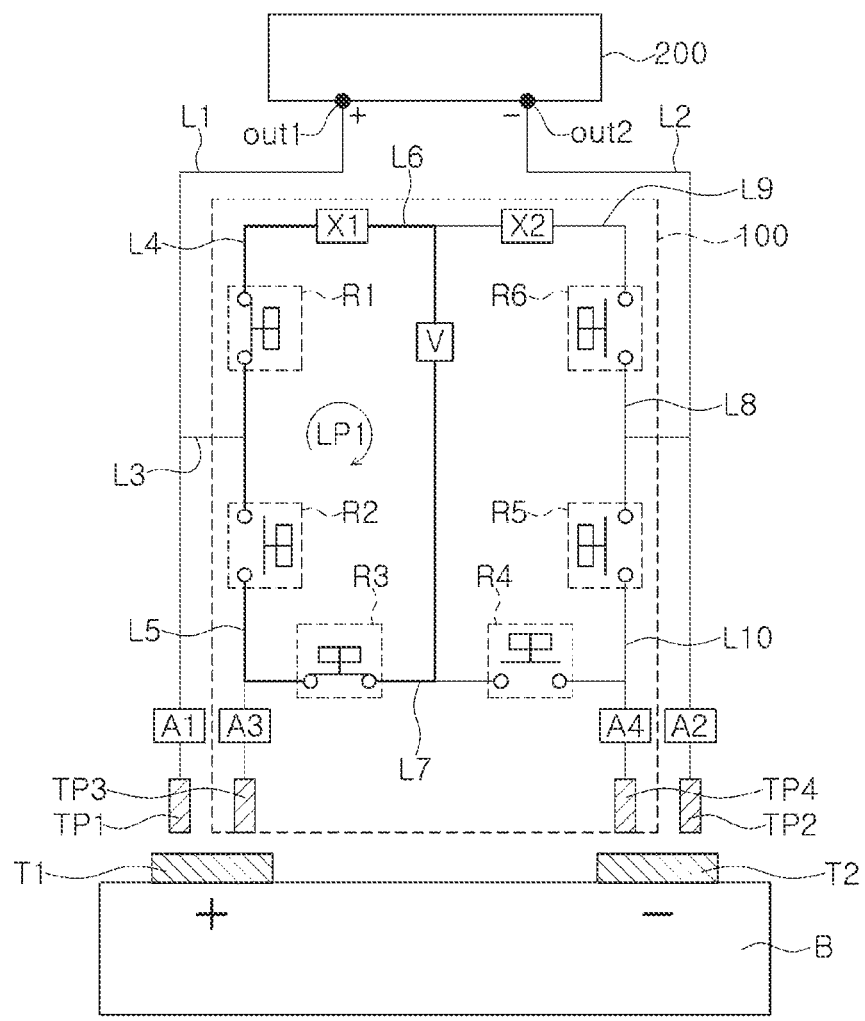

Referring to Table 1 and FIG. 5, the control unit 110 may perform the third test. The third test is a test for checking whether the second switch unit R2 is defective in not being operated while being short-circuited. The control unit 110 may maintain the first to fourth probes TP1 to TP4 to be disconnected from the first and second terminals T1 and T2 of the battery B. The control unit 110 may turn off the second switch unit R2 and the fourth to sixth switch units R4 to R6, turn on the first and third switch units R1 and R3, and then check whether the OFF signal is transmitted from the first continuity detection unit X1. When the OFF signal is transmitted from the first continuity detection unit X1, it may be confirmed that the second switch unit R2 is normally operated. On the other hand, when the ON signal is transmitted from the first continuity detection unit X1, it may be confirmed that the second switch unit R2 is defective in not being operated while being short-circuited, thus forming the first closed loop LP1. When the ON signal is transmitted from the first continuity detection unit X1, the control unit 110 may stop the test and send the alarm.

Figure 6:
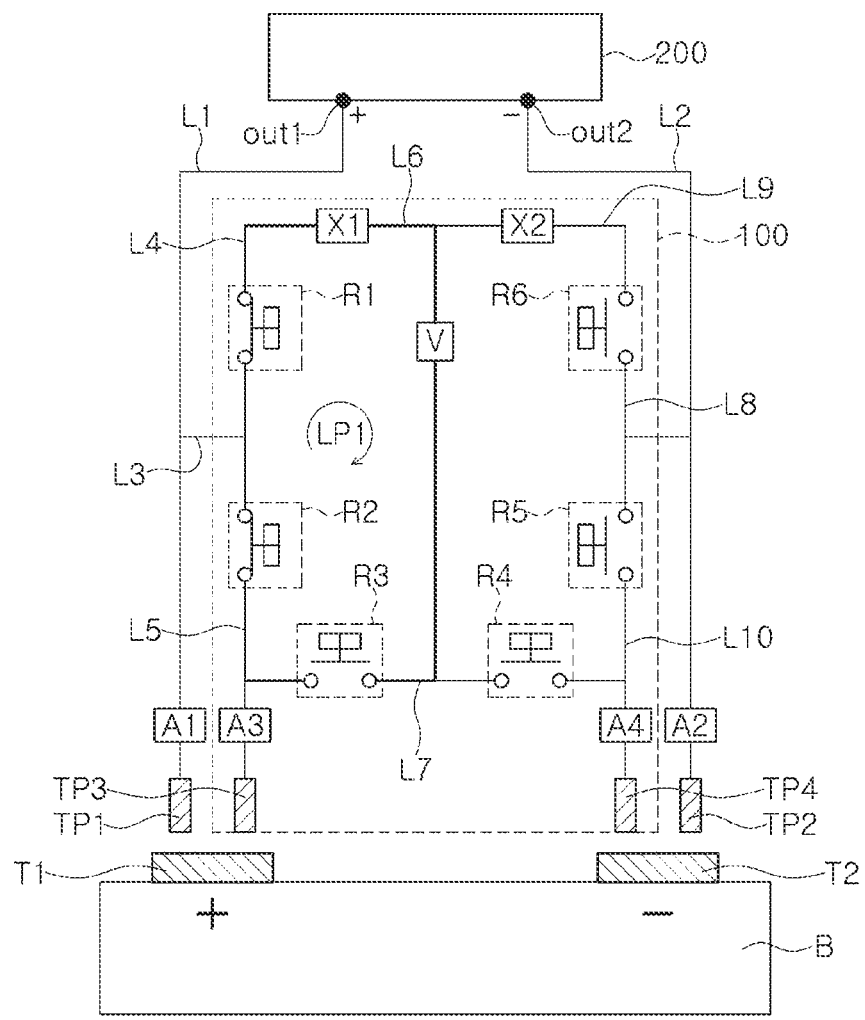

Referring to Table 1 and FIG. 6, the control unit 110 may perform the fourth test. The fourth test is a test for checking whether the third switch unit R3 is defective in not being operated while being short-circuited. The control unit 110 may maintain the first to fourth probes TP1 to TP4 to be disconnected from the first and second terminals T1 and T2 of the battery B. The control unit 110 may turn off the third switch unit R3 and the fourth to sixth switch units R4 to R6, turn on the first and second switch units R1 and R2, and then check whether the OFF signal is transmitted from the first continuity detection unit X1. When the OFF signal is transmitted from the first continuity detection unit X1, it may be confirmed that the third switch unit R3 is normally operated. On the other hand, when the ON signal is transmitted from the first continuity detection unit X1, it may be confirmed that the third switch unit R3 is defective in not being operated while being short-circuited, thus forming the first closed loop LP1. When the ON signal is transmitted from the first continuity detection unit X1, the control unit 110 may stop the test and send the alarm.

Figure 7:
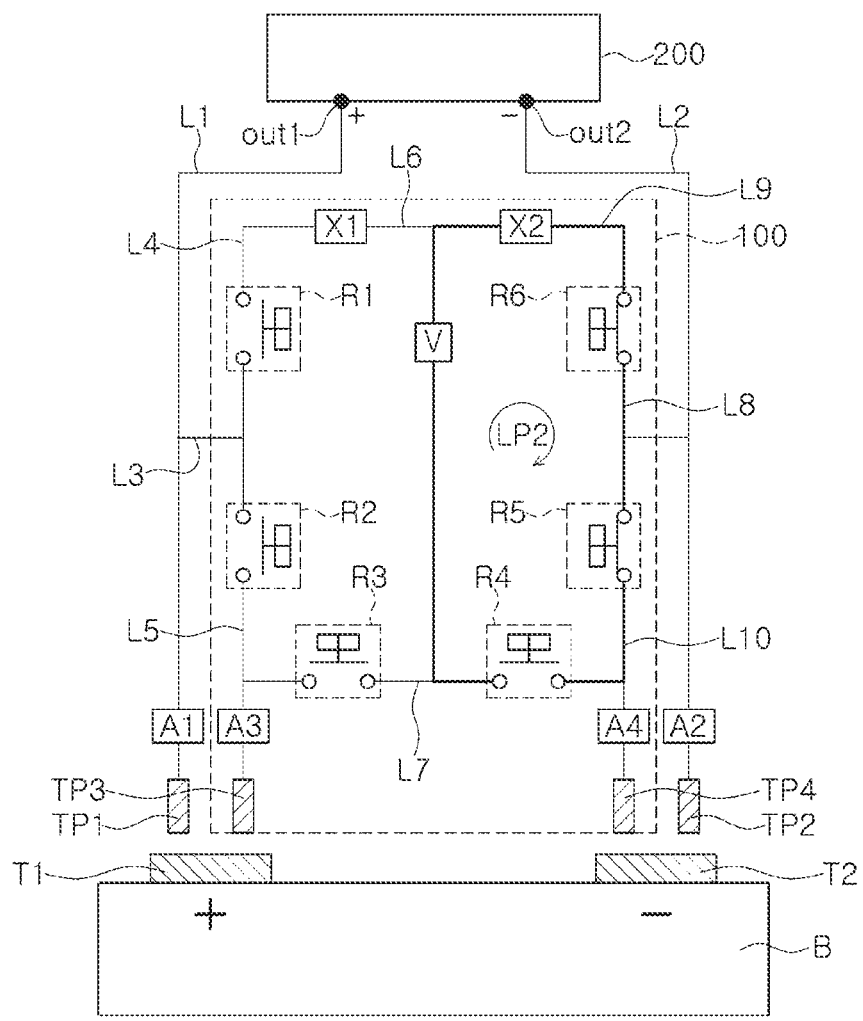

Referring to Table 1 and FIG. 7, the control unit 110 may perform the fifth test. The fifth test is a test for checking whether the fourth switch unit R4 is defective in not being operated while being short-circuited. The control unit 110 may maintain the first to fourth probes TP1 to TP4 to be disconnected from the first and second terminals T1 and T2 of the battery B. The control unit 110 may turn off the fourth switch unit R4 and the first to third switch units R1 to R3, turn on the fifth and sixth switch units R5 and R6, and then check whether the OFF signal is transmitted from the second continuity detection unit X2. When the OFF signal is transmitted from the second continuity detection unit X2, it may be confirmed that the fourth switch unit R4 is normally operated. On the other hand, when the ON signal is transmitted from the second continuity detection unit X2, it may be confirmed that the fourth switch unit R4 is defective in not being operated while being short-circuited, thus forming the second closed loop LP2. When the ON signal is transmitted from the second continuity detection unit X2, the control unit 110 may stop the test and send the alarm.

Figure 8:
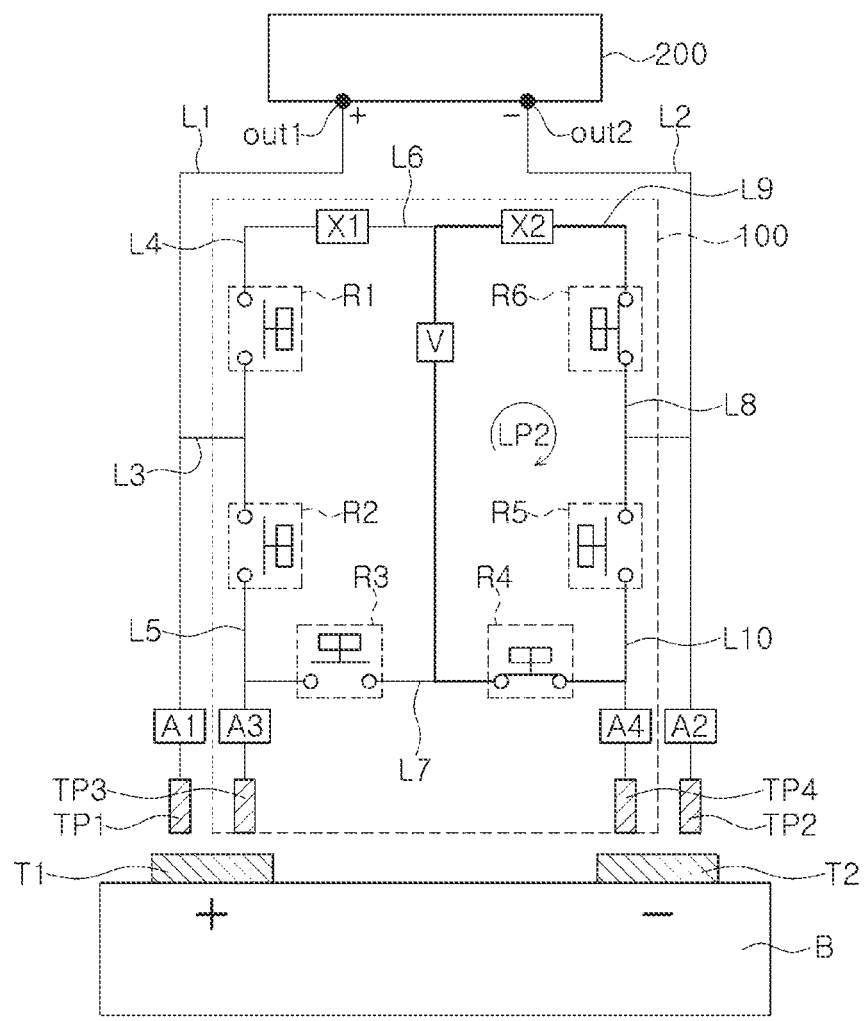

Referring to Table 1 and FIG. 8, the control unit 110 may perform the sixth test. The sixth test is a test for checking whether the fifth switch unit R5 is defective in not being operated while being short-circuited. The control unit 110 may maintain the first to fourth probes TP1 to TP4 to be disconnected from the first and second terminals T1 and T2 of the battery B. The control unit 110 may turn off the fifth switch unit R5 and the first to third switch units R1 to R3, turn on the fourth and sixth switch units R4 and R6, and then check whether the OFF signal is transmitted from the second continuity detection unit X2. When the OFF signal is transmitted from the second continuity detection unit X2, it may be confirmed that the fifth switch unit R5 is normally operated. On the other hand, when the ON signal is transmitted from the second continuity detection unit X2, it may be confirmed that the fifth switch unit R5 is defective in not being operated while being short-circuited, thus forming the second closed loop LP2. When the ON signal is transmitted from the second continuity detection unit X2, the control unit 110 may stop the test and send the alarm.

Figure 9:
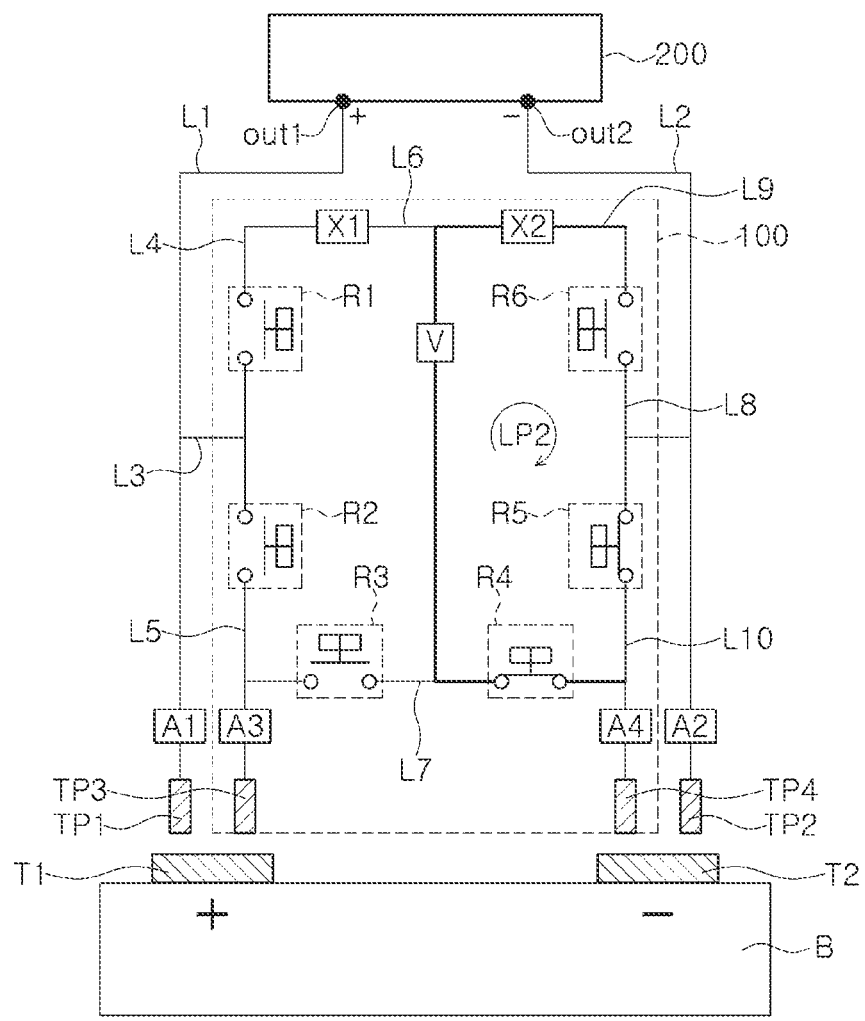

Referring to Table 1 and FIG. 9, the control unit 110 may perform the seventh test. The seventh test is a test for checking whether the sixth switch unit R6 is defective in not being operated while being short-circuited. The control unit 110 may maintain the first to fourth probes TP1 to TP4 to be disconnected from the first and second terminals T1 and T2 of the battery B. The control unit 110 may turn off the sixth switch unit R6 and the first to third switch units R1 to R3, turn on the fourth and fifth switch units R4 and R5, and then check whether the OFF signal is transmitted from the second continuity detection unit X2. When the OFF signal is transmitted from the second continuity detection unit X2, it may be confirmed that the sixth switch unit R6 is normally operated. On the other hand, when the ON signal is transmitted from the second continuity detection unit X2, it may be confirmed that the sixth switch unit R6 is defective in not being operated while being short-circuited, thus forming the second closed loop LP2. When the ON signal is transmitted from the second continuity detection unit X2, the control unit 110 may stop the test and send the alarm.

Figure 10:
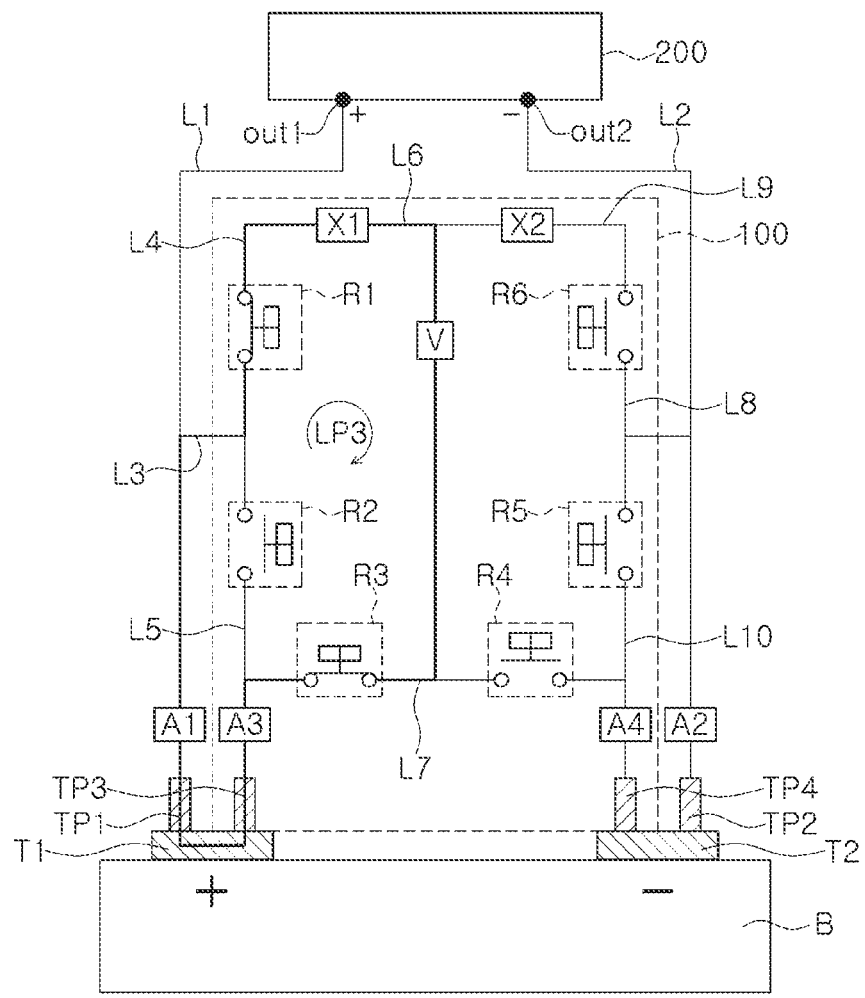

Referring to Table 1 and FIG. 10, the control unit 110 may perform the eighth test. The eighth test is a test for checking whether the first probe TP1 is directly connected to the first terminal T1 of the battery B. The control unit 110 may drive the first to fourth drive units A1 to A4 to connect the first to fourth probes TP1 to TP4 to the first and second terminals T1 and T2 of the battery B. The control unit 110 may turn off the second switch unit R2 and the fourth to sixth switch units R4 to R6, turn on the first and third switch units R1 and R3, and then check whether the ON signal is transmitted from the first continuity detection unit X1. When the ON signal is transmitted from the first continuity detection unit X1, it may be confirmed that the first probe TP1 is directly connected to the first terminal T1 of the battery B. On the other hand, when the OFF signal is transmitted from the first continuity detection unit X1, it may be confirmed that the first probe TP1 is defective in not being directly connected to the first terminal T1 of the battery B. When the OFF signal is transmitted from the first continuity detection unit X1, the control unit 110 may stop the test and send the alarm.

Figure 11:
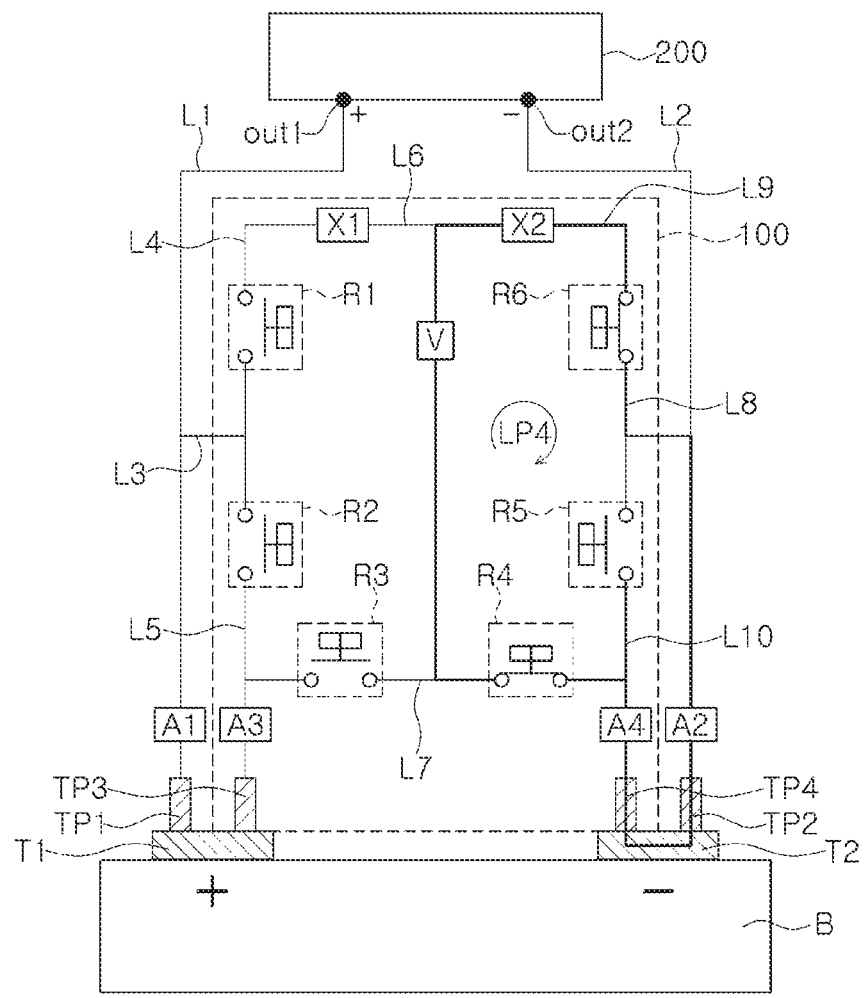

Referring to Table 1 and FIG. 11, the control unit 110 may perform the ninth test. The ninth test is a test for checking whether the second probe TP2 is directly connected to the second terminal T2 of the battery B. The control unit 110 may maintain the first to fourth probes TP1 to TP4 to be connected to the first and second terminals T1 and T2 of the battery B. The control unit 110 may turn off the fifth switch unit R5 and the first to third switch units R1 to R3, turn on the fourth and sixth switch units R4 and R6, and then check whether the ON signal is transmitted from the second continuity detection unit X2. When the ON signal is transmitted from the second continuity detection unit X2, it may be confirmed that the second probe TP2 is directly connected to the second terminal T2 of the battery B. On the other hand, when the OFF signal is transmitted from the second continuity detection unit X2, it may be confirmed that the second probe TP2 is defective in not being directly connected to the second terminal T2 of the battery B. When the OFF signal is transmitted from the second continuity detection unit X2, the control unit 110 may stop the test and send the alarm.

Figure 12:
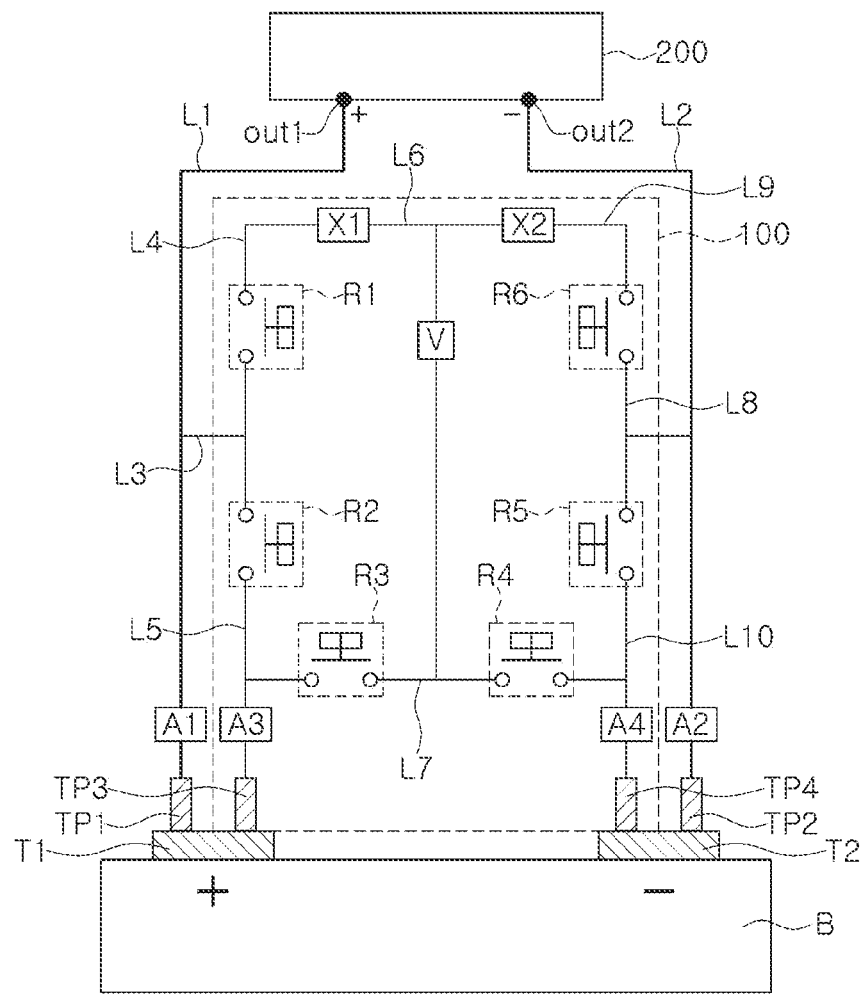

Referring to Table 1 and FIG. 12, the hi-pot test device 200 may perform the tenth test after the first to ninth tests are completed. The control unit 110 may maintain the first and second probes TP1 and TP2 to be connected to the first and second terminals T1 and T2 of the battery B, and selectively connect the third and fourth probes TP3 and TP4 to the first and second terminals T1 and T2 of the battery B. The hi-pot test device 200 may perform the hi-pot test by applying the high voltage to the first and second terminals T1 and T2 of the battery B.

As set forth above, the contact test device for a hi-pot test according to the spirit of the present disclosure may detect whether the probe is actually connected to the terminal of the battery in the process of the hi-pot test of the battery, thereby securing the reliability of the hi-pot test.

The hi-pot test system according to the spirit of the present disclosure may detect whether the probe is actually connected to the terminal of the battery in the process of the hi-pot test of the battery, thereby securing the reliability of the hi-pot test.

While exemplary embodiments have been shown and described above, it will be apparent to those skilled in the art that modifications and variations could be made without departing from the scope of the present disclosure as defined by the appended claims.

What is claimed is:

1. A contact test device for a hi-pot test, the device comprising a contact test device connected to a hi-pot test device in parallel by lines branched from first and second lines of the hi-pot test device performing a hi-pot test by being connected to first and second terminals of a battery through first and second probes, respectively, and connected to the first and second probes through the first and second lines, respectively, and having third and fourth probes directly connected to the first and second terminals of the battery, wherein the contact test device includes:
a first closed loop connected to the first line, and including first to third switch units connected to each other in series, a direct current (DC) voltage source and a first continuity detection unit, the first line being connected between the first switch unit and the second switch unit, and the third probe being connected between the second switch unit and the third switch unit;
a second closed loop connected to the second line, and including fourth to sixth switch units connected to each other in series, the DC voltage source and a second continuity detection unit, the second line being connected between the fifth switch unit and the sixth switch unit, and the fourth probe being connected between the fourth switch unit and the fifth switch unit; and
a control unit controlling turning the first to sixth switch units on and off and detecting a continuity signal of each of the first and second continuity detection units.

2. The device of claim 1, wherein the control unit sequentially performs
a first test of turning on the first to sixth switch units and detecting the continuity signal of each of the first and second continuity detection units;
a second test of turning on the second and third switch units, turning off the first switch unit and the fourth to sixth switch units, and detecting the continuity signal of the first continuity detection unit;
a third test of turning on the first and third switch units, turning off the second switch unit and the fourth to sixth switch units, and detecting the continuity signal of the first continuity detection unit;
a fourth test of turning on the first and second switch units, turning off the third to sixth switch units, and detecting the continuity signal of the first continuity detection unit;
a fifth test of turning on the fifth and sixth switch units, turning off the first to fourth switch units, and detecting the continuity signal of the second continuity detection unit;
a sixth test of turning on the fourth and sixth switch units, turning off the first to third switch units and the fifth switch unit, and detecting the continuity signal of the second continuity detection unit;

a seventh test of turning on the fourth and fifth switch units, turning off the first to third switch units and the sixth switch unit, and detecting the continuity signal of the second continuity detection unit;
an eighth test of turning on the first and third switch units, turning off the second switch unit and the fourth to sixth switch units, and detecting the continuity signal of the first continuity detection unit; and
a ninth test of turning on the fourth and sixth switch units, turning off the first to third switch units and the fifth switch unit, and detecting the continuity signal of the second continuity detection unit.

3. The device of claim 1, wherein the first and second probes are respectively spaced apart from the third and fourth probes.

4. The device of claim 1, wherein the control unit stores the number of times the first to sixth switch units are turned on and off.

5. The device of claim 1, wherein the DC voltage source supplies a voltage of 24 V.

6. The device of claim 1, wherein the switch units are power relay.

7. The device of claim 1, further comprising first to fourth drive units respectively moving the first to fourth probes forward and backward to be connected to or disconnected from the first and second terminals.

8. A hi-pot test system comprising:
a hi-pot test device performing a hi-pot test by being connected to first and second terminals of a battery through first and second probes, respectively, the first and second probes being connected to the hi-pot test device respectively through first and second lines; and
a contact test device connected to the hi-pot test device in parallel by lines branched from the first and second lines, and having third and fourth probes directly connected to the first and second terminals of the battery,
wherein the contact test device includes:
a first closed loop connected to the first line, and including first to third switch units connected to each other in series, a direct current (DC) voltage source and a first continuity detection unit, the first line being connected between the first switch unit and the second switch unit, and the third probe being connected between the second switch unit and the third switch unit;
a second closed loop connected to the second line, and including fourth to sixth switch units connected to each other in series, the DC voltage source and a second continuity detection unit, the second line being connected between the fifth switch unit and the sixth switch unit, and the fourth probe being connected between the fourth switch unit and the fifth switch unit; and
a control unit controlling turning the first to sixth switch units on and off and detecting a continuity signal of each of the first and second continuity detection units.

9. The hi-pot test system of claim 8, wherein the control unit sequentially performs
a first test of turning on the first to sixth switch units and detecting the continuity signal of each of the first and second continuity detection units;
a second test of turning on the second and third switch units, turning off the first switch unit and the fourth to sixth switch units, and detecting the continuity signal of the first continuity detection unit;
a third test of turning on the first and third switch units, turning off the second switch unit and the fourth to sixth switch units, and detecting the continuity signal of the first continuity detection unit;

a fourth test of turning on the first and second switch units, turning off the third to sixth switch units, and detecting the continuity signal of the first continuity detection unit;

a fifth test of turning on the fifth and sixth switch units, turning off the first to fourth switch units, and detecting the continuity signal of the second continuity detection unit;

a sixth test of turning on the fourth and sixth switch units, turning off the first to third switch units and the fifth switch unit, and detecting the continuity signal of the second continuity detection unit;

a seventh test of turning on the fourth and fifth switch units, turning off the first to third switch units and the sixth switch unit, and detecting the continuity signal of the second continuity detection unit;

an eighth test of turning on the first and third switch units, turning off the second switch unit and the fourth to sixth switch units, and detecting the continuity signal of the first continuity detection unit; and a ninth test of turning on the fourth and sixth switch units, turning off the first to third switch units and the fifth switch unit, and detecting the continuity signal of the second continuity detection unit.

10. The hi-pot test system of claim 9, wherein the hi-pot test is performed by applying a high voltage to the first and second terminals of the battery through the first and second probes after the first to ninth tests are performed.

* * * * *